United States Patent
Lee et al.

(10) Patent No.: US 6,235,585 B1
(45) Date of Patent: May 22, 2001

(54) METHOD FOR FABRICATING FLASH MEMORY DEVICE AND PERIPHERAL AREA

(75) Inventors: Sung Chul Lee, Chungcheongbuk-do; Jae Seung Choi, Seoul, both of (KR)

(73) Assignee: Hyundai Electronics Industries Co., Ltd., Kyoungki-Do (KR)

( * ) Notice: Subject to any disclaimer, the term of this patent is extended or adjusted under 35 U.S.C. 154(b) by 0 days.

(21) Appl. No.: 09/306,436

(22) Filed: May 6, 1999

(30) Foreign Application Priority Data

Sep. 29, 1998 (KR) .................................................. 98 40627

(51) Int. Cl.$^7$ ................................................ H01L 21/8247
(52) U.S. Cl. ........................... 438/258; 438/264; 438/981
(58) Field of Search .................................... 438/258, 261, 438/264, 265, 593, 594, 981

(56) References Cited

U.S. PATENT DOCUMENTS

| | | | |
|---|---|---|---|
| 5,104,819 | 4/1992 | Freiberger et al. | 437/43 |
| 5,188,976 | * 2/1993 | Kume et al. | 438/258 |
| 5,223,451 | * 6/1993 | Uemura et al. | 438/258 |
| 5,792,696 | * 8/1998 | Kim et al. | 438/258 |
| 5,888,869 | * 3/1999 | Cho et al. | 438/258 |

* cited by examiner

Primary Examiner—Chandra Chaudhari
(74) Attorney, Agent, or Firm—Fleshner & Kim, LLP

(57) ABSTRACT

Methods for fabricating a flash memory device which improves both charge retaining characteristics and characteristics of a gate insulating film are disclosed. The methods include the steps of respectively forming a tunneling oxide film and a peripheral oxide film on a cell and peripheral areas of a semiconductor substrate; forming a floating gate line on the tunneling oxide film; forming a first insulating film on a surface of the floating gate line; forming a second insulating film on an entire surface of the semiconductor substrate; forming a third insulating film on the second insulating film so that the third insulating film is thicker than the peripheral oxide film; removing the third insulating film and the second insulating film from the peripheral area by wet etching processes; removing the peripheral oxide film by a wet etching process; forming a gate insulating film on the surface of the semiconductor substrate in the peripheral area; depositing a conductive layer on the entire surface of the semiconductor substrate; selectively removing portions of the conductive layer, the third insulating film, the second insulating film, the first insulating film, and the floating gate line to form a control gate and a floating gate in the cell area, and a gate electrode of a thin film transistor in the peripheral area; and forming source/drain impurity areas within the surface of the semiconductor substrate at both sides of the control gate and floating gate and at both sides of the gate electrode.

28 Claims, 6 Drawing Sheets

METHOD FOR FABRICATING FLASH MEMORY DEVICE AND PERIPHERAL AREA

BACKGROUND OF THE INVENTION

1. Field of the Invention

The present invention relates to methods for fabricating a semiconductor device and more particularly, a method of making a flash memory device.

2. Background of the Related Art

A related art method for fabricating a flash memory device will be described with reference to FIGS. 1a to 1h, which are sectional views illustrating steps of the related art method.

Figure 1A:
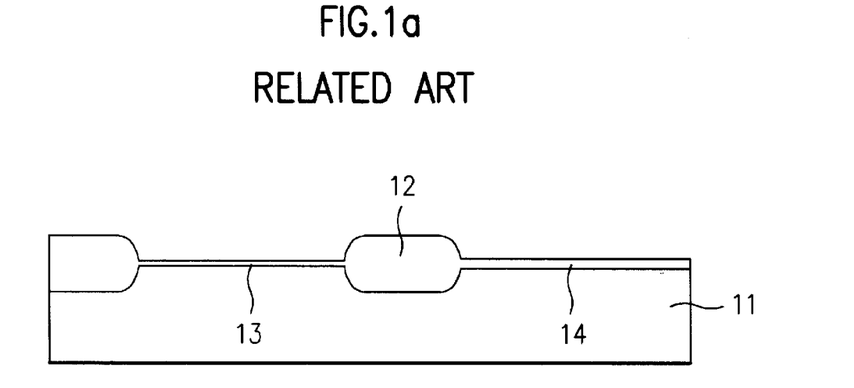
FIGS. 1a to 1h are sectional views illustrating a related art method for fabricating a flash memory device.

As shown in FIG. 1a, a field oxide film 12 is formed on a semiconductor substrate 11 in which a cell area and a peripheral area are defined. A tunneling oxide film 13 is formed on the cell area of the semiconductor substrate 11 in which the field oxide film 12 is not formed. A peripheral oxide film 14 is formed on the peripheral area of the semiconductor substrate 11 in which field oxide film 12 is not formed.

The formation process (not shown in detail) of the tunneling oxide film 13 and the peripheral oxide film 14 includes the steps of forming the field oxide film 12 on the semiconductor substrate 11, forming an oxide film on a surface of the semiconductor substrate 11 in which the field oxide film 12 is not formed, removing the oxide film from the cell area, thermally oxidizing the semiconductor substrate 11 to form the tunneling oxide film 13 on the cell area, and forming the peripheral oxide film 14 on the peripheral area by stacking the tunneling oxide film 13 and the oxide film.

Figure 1B:
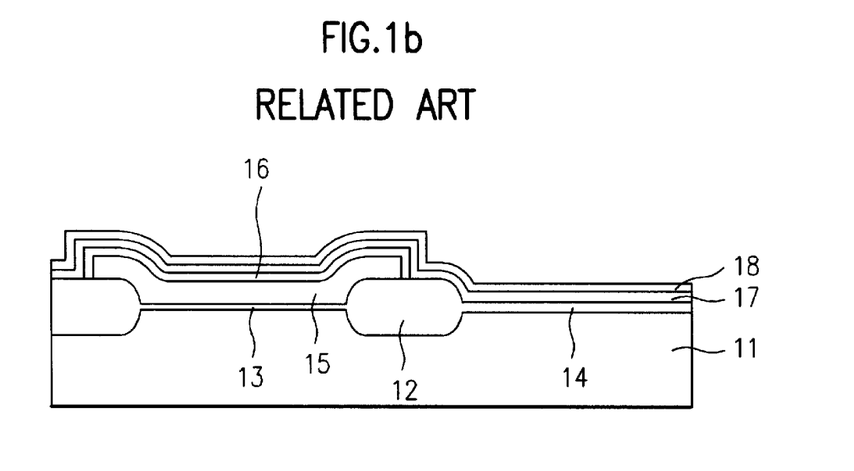

As shown in FIG. 1b, a first polysilicon layer for a floating gate is formed on an entire surface of the semiconductor substrate 11 including the tunneling oxide film 13 and the peripheral oxide film 14. The first polysilicon layer is patterned by a photolithography and etching process so that it only remains on the tunneling oxide film 13 of the cell area, and the field oxide film 12 adjacent to the tunneling oxide film 13. The patterned polysilicon layer becomes a floating gate line 15.

Subsequently, a thermal oxidation process is performed on the semiconductor substrate 11 to form a lower oxide film 16 on a surface of the floating gate line 15. A silicon nitride film 17 is formed on the entire surface of the semiconductor substrate 11, including the lower oxide film 16. A thermal oxidation process is then performed on the semiconductor substrate 11 to form an upper oxide film 18 on the silicon nitride film 17.

Figure 1C:
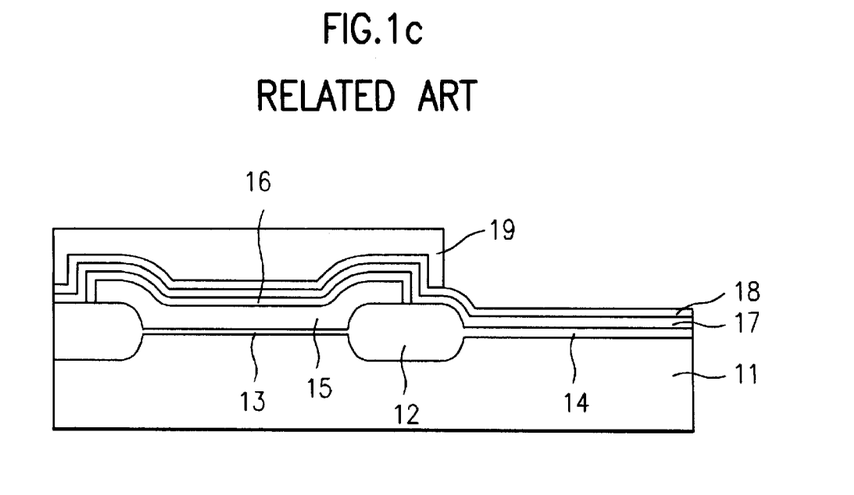

As shown in FIG. 1c, a first photoresist 19 is then deposited on the upper oxide film 18, and the first photoresist is patterned by exposure and developing processes so that it only remains on the cell area.

Figure 1D:
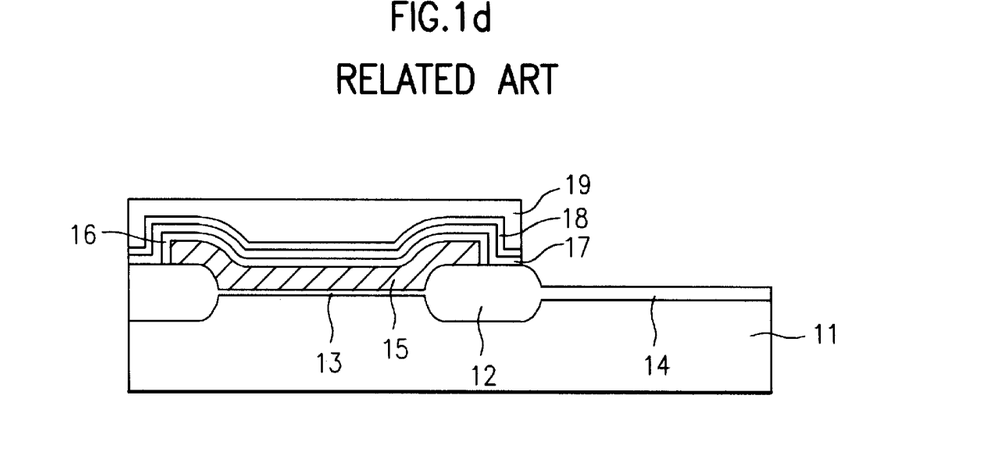

As shown in FIG. 1d, the upper oxide film 18 and the silicon nitride film 17 of the peripheral area are selectively removed by a dry etching process using the patterned first photoresist 19 as a mask.

Figure 1E:
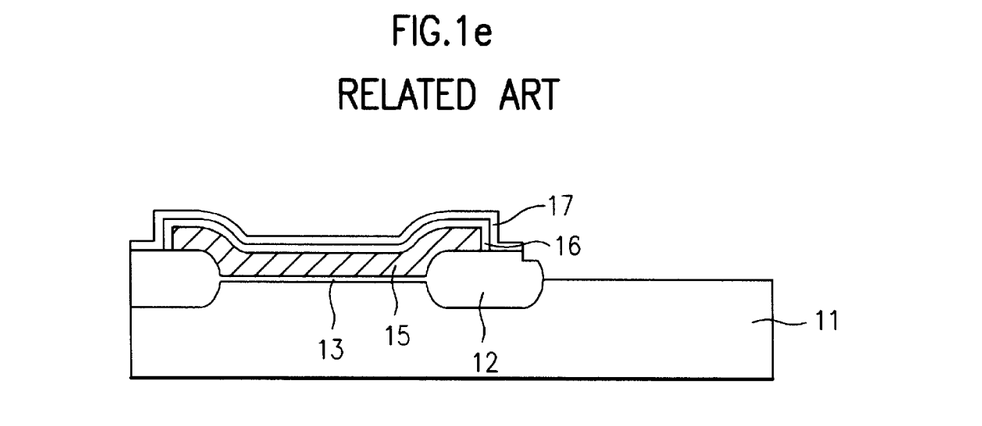

As shown in FIG. 1e, the first photoresist 19 is removed, and the peripheral oxide film 14 of the peripheral area is removed by wet etching process. When removing the peripheral oxide film 14 by the wet etching process, the upper oxide film 18 of the cell area is also completely removed.

Figure 1F:
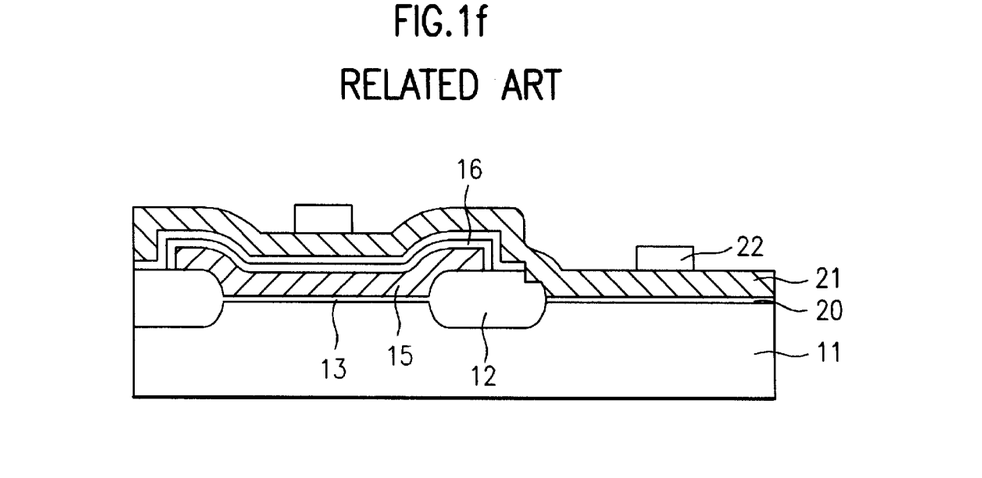

As shown in FIG. 1f, a gate oxide film 20 is then formed on the surface of the semiconductor substrate 11 of the peripheral area, and a second polysilicon layer 21 is formed on the entire surface of the semiconductor substrate 11, including the gate oxide film 20.

A second photoresist 22 is deposited on the second polysilicon layer 21 and is then patterned by exposure and developing processes to define gate areas.

Figure 1G:
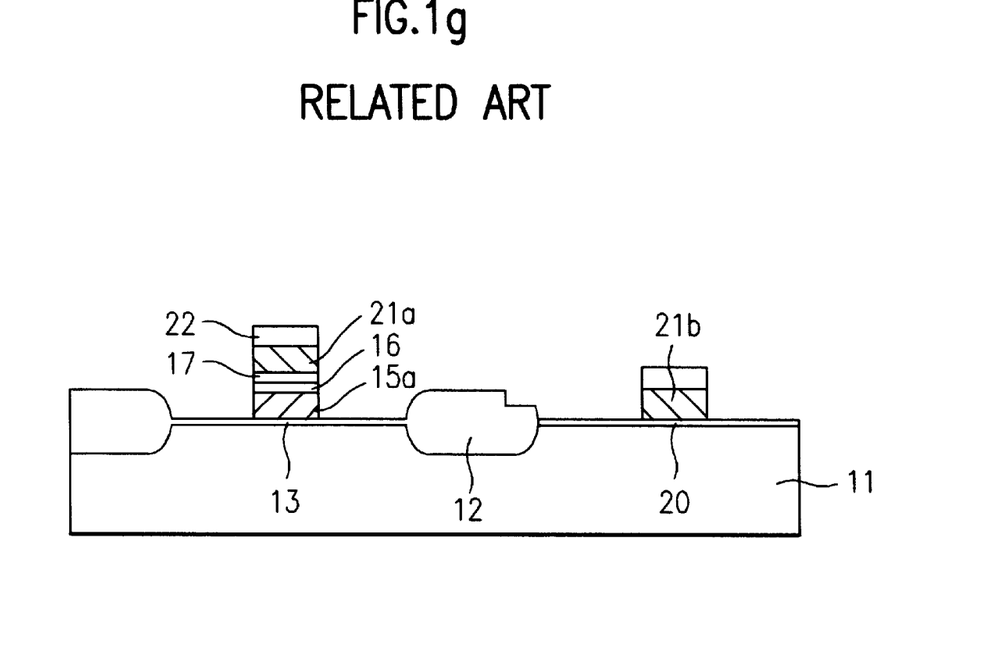

As shown in FIG. 1g, the second polysilicon layer 21, the silicon nitride film 17, the lower oxide film 16, and the floating gate line 15 are selectively removed using the patterned photoresist 22 as a mask so that a control gate 21a and a floating gate 15a are formed in the cell area and a gate electrode 21b of a thin film transistor is formed in the peripheral area. At this time, the silicon nitride film 17 and the lower oxide film 16 remain between the control gate 21a and the floating gate 15a.

Figure 1H:
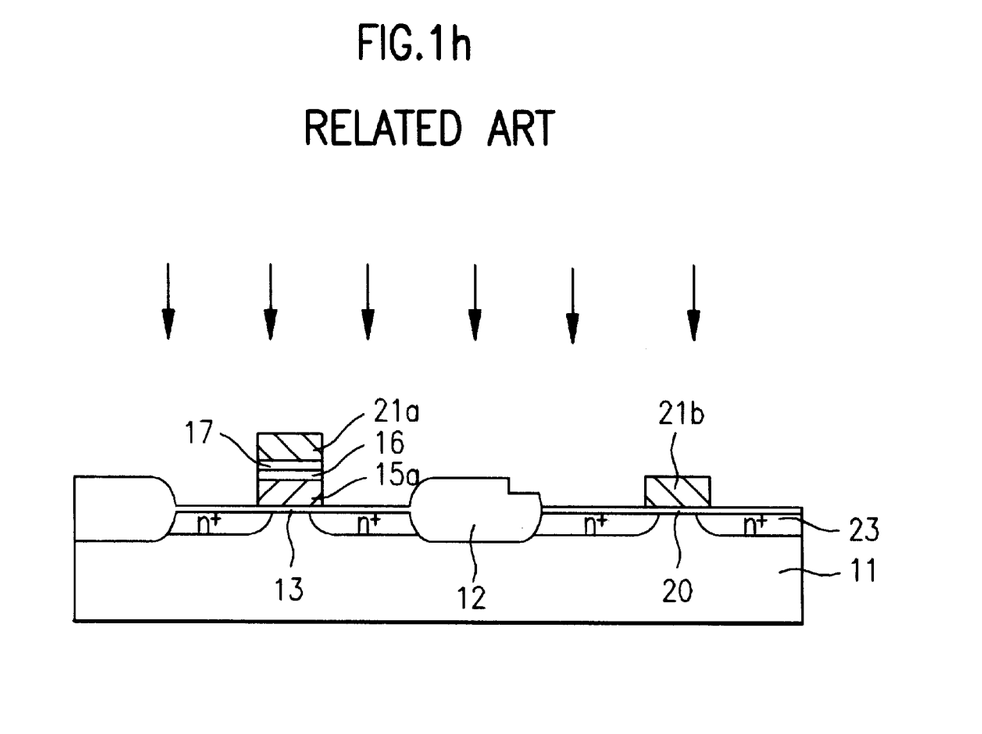

As shown in FIG. 1h, the second photoresist 22 is removed, and impurity ions for source/drain regions are implanted into the entire surface of the semiconductor substrate 11 using the control gate 21a, the floating gate 15a and the gate electrode 21b as masks. This causes a source/drain impurity area 23 to be formed within the surface of the semiconductor substrate 11 at both sides of the control gate 21a and the floating gate 15a and at both sides of the gate electrode 21b.

The aforementioned related art method for fabricating a flash memory device has several problems. For example, when etching the upper oxide film 18 and the silicon nitride film 17 of the peripheral area with a dry etching process, the surface of the semiconductor substrate may be exposed, thereby deteriorating characteristics of the gate insulating film which is to be subsequently formed over the peripheral area. In other words, the peripheral oxide film 14 is intended to remain over the substrate during the dry etching process to protect the substrate when the upper oxide film 18 and the silicon nitride film 17 are removed from the peripheral area. Then, the peripheral oxide film 14 is to be removed by wet etching. However, the selectivity of the oxide film is low when dry-etching the silicon nitride film 17, and the etching speed is 70 Å per sec. or greater, so that the peripheral oxide film 14 may be significantly etched when dry etching the silicon nitride film 17. If the silicon nitride film dry etching process is conducted too long, the surface of the semiconductor substrate may be exposed. This makes the thickness of the gate insulating film 20 which is grown on the peripheral region of the semiconductor substrate difficult to control, thereby deteriorating characteristics of the gate insulating film.

Further, removing, by wet etching, the peripheral oxide film 14 which remains after etching the silicon nitride film 17 away from the peripheral area, the upper oxide film 18 of the cell area is also removed. Also, if the peripheral oxide film 14 is removed from the peripheral area at the same time as the upper oxide film 18 and the silicon nitride film 17, the upper oxide film of the cell area can remain, but the other oxide films can be damaged during the cleaning process for forming the gate insulating film. To avoid this problem, an interleave insulating film of the cell area, which consists of the silicon nitride film 17 and the lower oxide film 16, has a nitride/oxide (NO) structure. However, this reduces a charge retaining characteristic of the flash memory cell because a design rule prefers an oxide/nitride/oxide (ONO) structure between the control and floating gates, not just a nitride/oxide (NO) structure.

SUMMARY OF THE INVENTION

The present invention is a method for fabricating a flash memory device that substantially obviates one or more of the problems and disadvantages of the related art discussed above.

An object of the present invention is to improve characteristics of a gate insulating film.

Another object of the present invention is to improve charge retaining characteristics of the resulting flash memory cells.

In a method embodying the invention, a tunneling oxide film and a peripheral oxide film, respectively, are first formed on a cell area and a peripheral area of a substrate. A floating gate line is then formed on a tunneling oxide film, and a first insulating film is formed on a surface of the floating gate line. An upper insulating film having a thickness greater than the peripheral oxide film is formed on an entire top surface of the substrate. The upper insulating film is then removed from the peripheral area of the substrate by an etching process. The peripheral oxide film, and a portion of the upper insulating film over the cell area, is then removed by a wet etching process. A gate insulating film is formed on the exposed surface of the semiconductor substrate in the peripheral area. A conductive layer is deposited on the entire top surface of the semiconductor substrate, and an etching process is performed to selectively remove portions of the conductive layer, the upper insulating film, the first insulating film, and the floating gate line to form a control gate and a floating gate in the cell area, and to form a gate electrode of a thin film transistor in the peripheral area.

In alternate embodiments of the invention, source and drain regions can be formed in the substrate on either sides of the control and floating gates, and on either sides of the gate electrode of the thin film transistor.

In still other embodiments, a second insulating film can be formed on an entire surface of the semiconductor substrate after the first insulating film has been formed. The upper insulating film would then be formed on a top surface of the second insulating film. This would result in a three layer ONO structure being formed between the control gate and the floating gate.

In still other embodiments of the invention, the method could include the steps of forming a tunneling oxide film on a semiconductor substrate, and forming a floating gate on the tunneling oxide film. Next a first insulating film would be formed on a surface of the floating gate line, and a second insulating film would be formed on an entire top surface of the substrate. A third insulating film could then be formed on the second insulating film. Next a portion of the third insulating film would be removed using a wet etching process. A conductive layer can be deposited on the entire surface of the semiconductor substrate, and etching can be performed to selectively remove portions of the conductive layer, the third insulating film, the second insulating film, the first insulating film, and the floating gate line to form a control gate and a floating gate. Finally, source and drain regions can be formed on either sides of the control and floating gates.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

A description of preferred embodiments of the invention will be provided in conjunction with the following drawing figures, wherein like elements are referred to with like reference numerals, and wherein.

DETAILED DESCRIPTION OF PREFERRED EMBODIMENTS

Figure 2A:
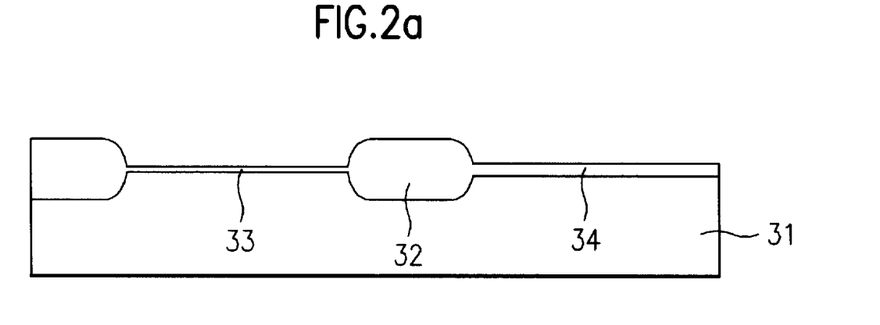
FIGS. 2a to 2i are sectional views illustrating a method for fabricating a flash memory device according to the present invention.

In a first method embodying the invention, as shown in FIG. 2a, a field oxide film 32 is formed on a semiconductor substrate 31 in which a cell area and a peripheral area are defined. A tunneling oxide film 33, having a thickness of about 100 Å or less, is formed on the cell area of the semiconductor substrate 31. A peripheral oxide film 34, having a thickness of 200 Å or less, is formed on the peripheral area of the semiconductor substrate 31.

The formation process (not shown in detail) of the tunneling oxide film 33 and the peripheral oxide film 34 include the steps of forming the field oxide film 32 on the semiconductor substrate 31, forming an oxide film on a surface of the semiconductor substrate 31 in which the field oxide film 32 is not formed, removing the oxide film from only the cell area, and thermally oxidizing the semiconductor substrate 31 to form the tunneling oxide film 33 on the cell area. The peripheral oxide film 34 formed on the peripheral area includes the tunneling oxide film stacked on the original oxide film.

Figure 2B:
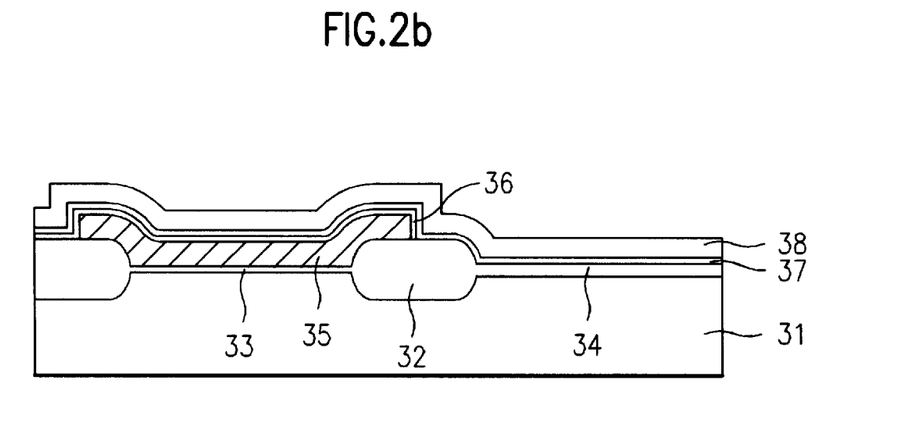

As shown in FIG. 2b, a first conductive layer for a floating gate, which can be a first polysilicon layer, is formed on an entire surface of the semiconductor substrate 31, including the tunneling oxide film 33 and the peripheral oxide film 34. The first conductive layer is patterned by a photolithography and etching process so that it remains only on the tunneling oxide film 33 of the cell area and a portion of the field oxide film 32 adjacent to the tunneling oxide film 33. By this process, a floating gate line 35 is formed.

Subsequently, a thermal oxidation process is performed on the semiconductor substrate 31 to form a lower oxide film, which will be called a first insulating film 36. The first insulating film 36 is formed so that it has a thickness of about 150 Å or less, and so that it is formed on a surface of the floating gate line 35. A silicon nitride film having a thickness of about 120 Å or less, which will be called a second insulating film 37, is formed on the entire surface of the semiconductor substrate 31, including the first insulating film 36. An upper oxide film having a thickness of 300 Å or less, which will be called a third insulating film 38, is then formed on the semiconductor substrate 31 by a chemical vapor deposition (CVD) process. The third insulating film 38 may also be formed by thermal oxidation.

Figure 2C:
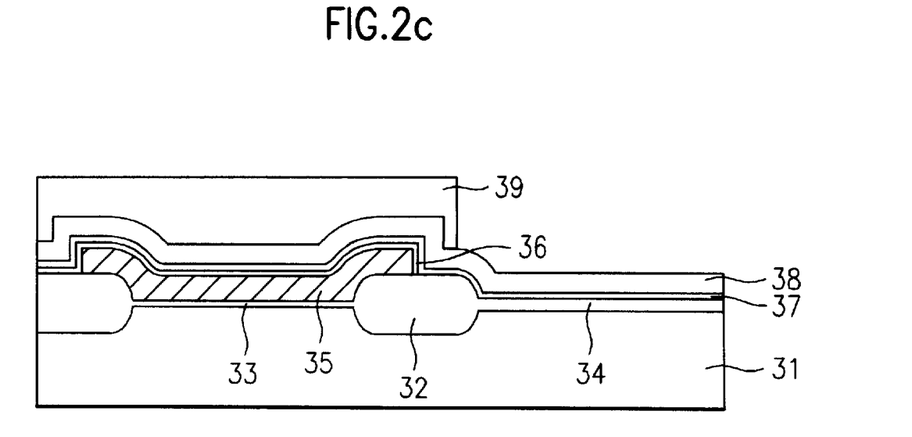

As shown in FIG. 2c, a first photoresist 39 is deposited on the third insulating film 38, and is then patterned by exposure and developing processes so that it only remains on the cell area.

Figure 2D:
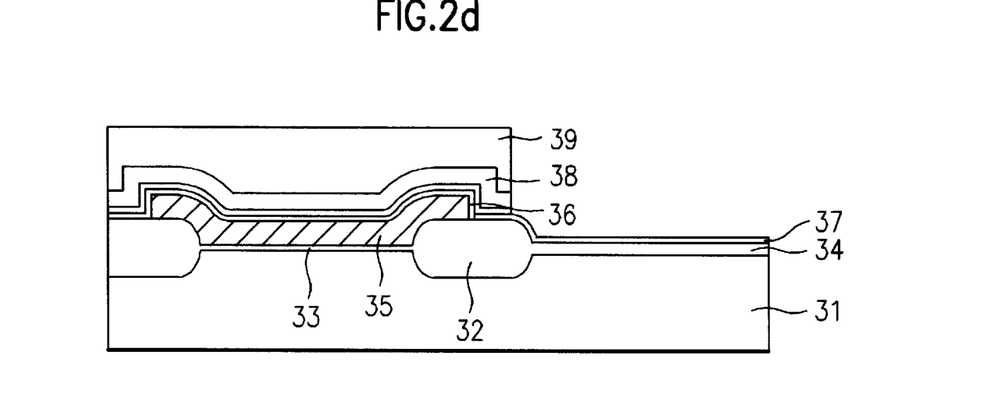

As shown in FIG. 2d, the third insulating film 38 in the peripheral area is removed, using the patterned first photoresist 39 as a mask, by a dry etching process. The dry etching process may be performed using a HF buffer solution or the like.

Figure 2E:
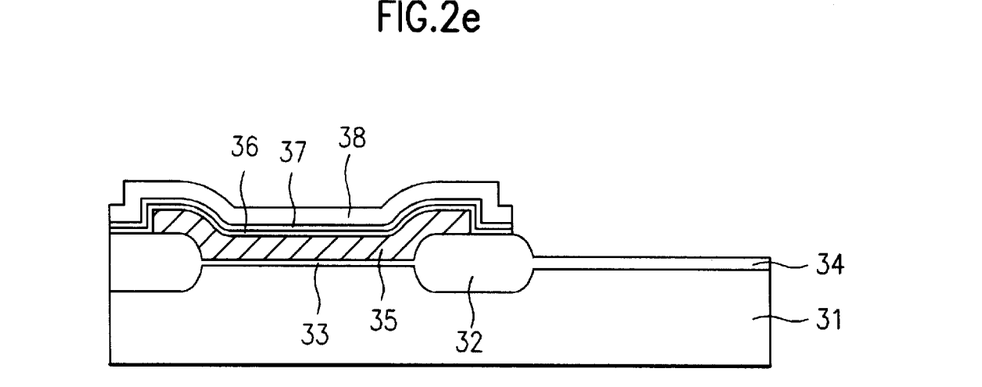

As shown in FIG. 2e, the first photoresist 39 is removed, and the second insulating film 37 in the peripheral area is removed by a wet etching process. The wet etching process may be performed using phosphate or the like. Since the second insulating film 37 and the third insulating film 38 in the cell area have different etching selectivity, the third insulating film 38 formed on the second insulating film 37 in the cell area serves to prevent the second insulating film 37 from being removed from the cell area.

Figure 2F:
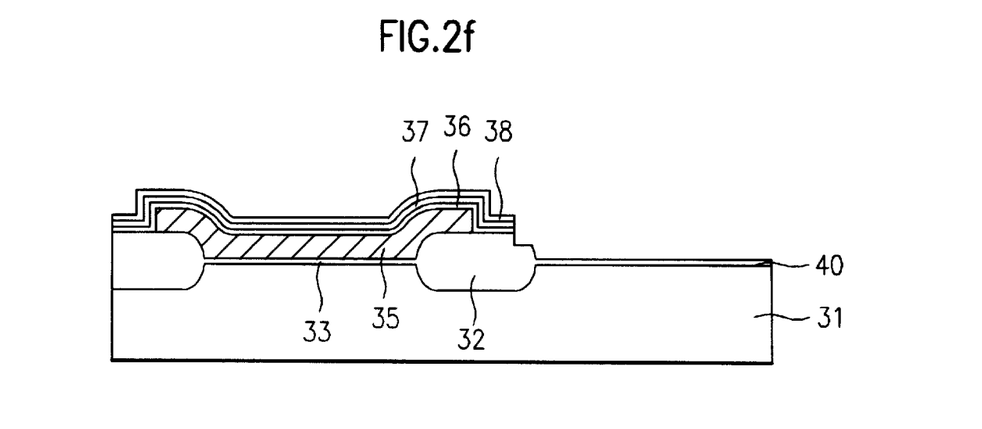

As shown in FIG. 2f, the peripheral oxide film 34 of the peripheral area is then selectively removed by a wet etching process. The wet etching process also simultaneously removes a portion of the third insulating film 38 in the cell area. However, since the third insulating film 38 is thicker than the peripheral oxide film 34, a portion of the third insulating film 38 having a thickness of about 50 Å remains in the cell area after all of the peripheral oxide film 34 has been removed from the peripheral area.

Figure 2G:
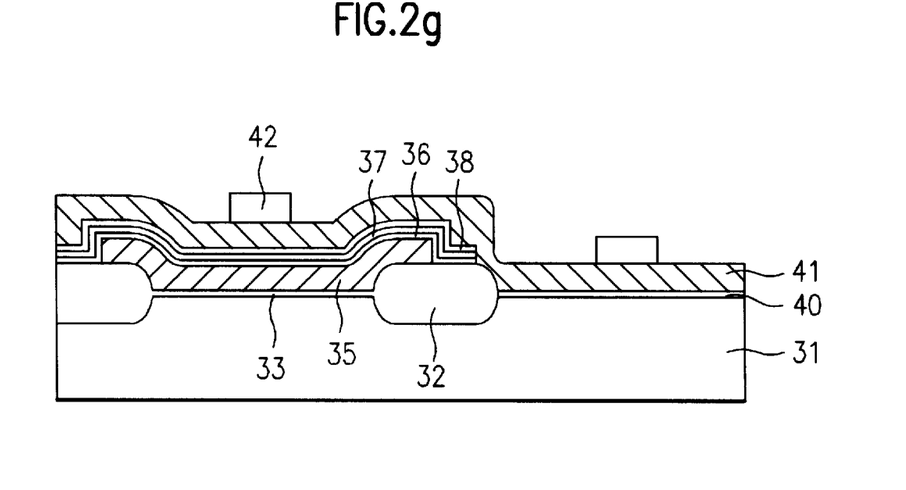

As shown in FIG. 2g, a gate oxide film 40 is then formed on the exposed semiconductor substrate 31 in the peripheral area, and a second polysilicon layer, which will be called a second conductive layer 41, is deposited on the entire surface of the semiconductor substrate 31, including the gate oxide film 40.

Subsequently, a second photoresist 42 is deposited on the second conductive layer 41 and is then patterned by exposure and developing processes to define gate areas.

Figure 2H:
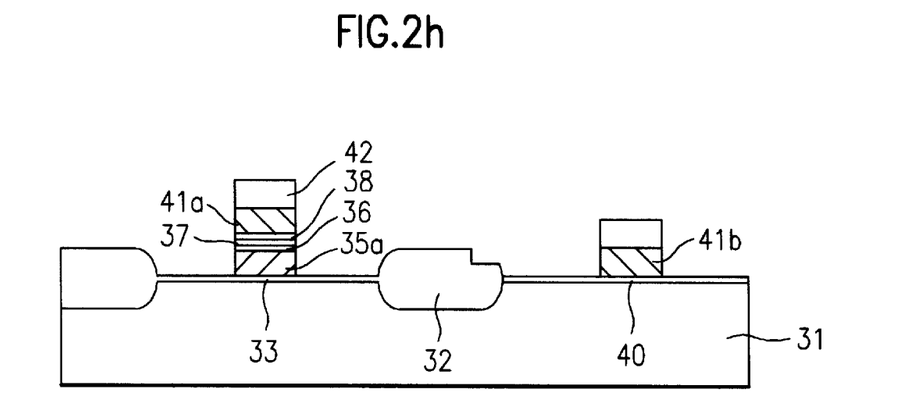

As shown in FIG. 2h, the second conductive layer 41, the third insulating film 38, the second insulating 37, the first insulating film 36, and the floating gate line 35 are selectively removed using the patterned second photoresist 42 as a mask so that a control gate 41a and a floating gate 35a are formed on the cell area. At the same time, a gate electrode 41b of a thin film transistor is formed on the peripheral area. The third insulating film 38, the second insulating film 37 and the first insulating film 36 provide an ONO structure between the control gate 41a and the floating gate 35a.

Figure 2I:
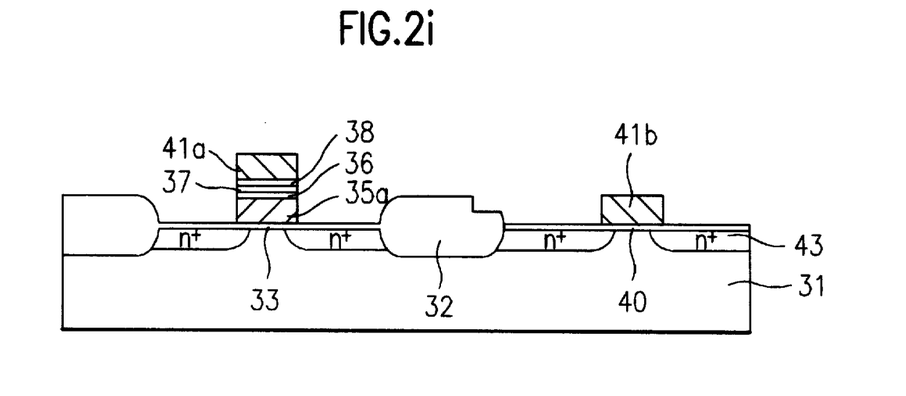

As shown in FIG. 2i, the patterned portions of the second photoresist 42 are then removed, and impurity ions for source/drain regions are implanted into the entire surface of the semiconductor substrate 31 using the control gate 41a, the floating gate 35a and the gate electrode 41b as masks. This results in the formation of a source/drain impurity area 43 within the surface of the semiconductor substrate 31 at both sides of the control gate 41a and the floating gate 35a and at both sides of the gate electrode 41b.

In an alternate method embodying the invention, ions can be implanted into the substrate after the third insulating film has been removed from the peripheral area. The ion implantation step can be used to adjust a threshold voltage of a thin film transistor that will be formed in the peripheral area.

As aforementioned, the method for fabricating a flash memory device according to the present invention has several advantages. Because the second and third insulating layers are removed from the peripheral area by wet etching processes, the underlying portion of the substrate 31 will not be damaged. This makes it easier to control the thickness of the gate insulating film that is subsequently formed in the peripheral area, which in turn prevents characteristics of the gate insulating film from being deteriorated. In addition, since the interleaved insulating film between the control gate and the floating gate of the cell area has an ONO structure, charge retaining characteristics are improved.

The foregoing embodiments are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, any means-plus-function clauses are intended to cover the structures described herein as performing the recited function and not only structural equivalents but also equivalent structures.

What is claimed is:

1. A method for fabricating a flash memory device, comprising:

forming a tunneling oxide film and a peripheral oxide film, respectively, on a cell area and a peripheral area of a substrate;

forming a floating gate line on the tunneling oxide film;

forming a first insulating film on a surface of the floating gate line;

forming an upper insulating film having a thickness greater than the peripheral oxide film on an entire top surface of the substrate;

removing the upper insulating film from the peripheral area by an etching process;

removing the peripheral oxide film and a portion of the upper insulating film over the cell area by an etching process;

forming a gate insulating film on a surface of the semiconductor substrate in the peripheral area; and selectively removing portions of the upper insulating film, the first insulating film, and the floating gate line.

2. A method for fabricating a flash memory device, comprising:

forming a tunneling oxide film and a peripheral oxide film, respectively, on a cell and a peripheral area of a substrate;

forming a floating gate line on the tunneling oxide film;

forming a first insulating film on a surface of the floating gate line;

forming an upper insulating film on an entire surface of the semiconductor substrate, wherein the upper insulating film has a thickness greater than the peripheral oxide film;

removing a portion of the upper insulating film from the peripheral area; and selectively removing a portion of the upper insulating film from the cell area and the peripheral oxide film from the peripheral area during a single etching step.

3. The method of claim 2, further comprising:

a step of forming a control gate and a floating gate; and a step of forming source/drain regions at sides of the control gate and the floating gate.

4. The method of claim 2, further comprising a step of forming a conductive layer, wherein the selectively removing step further comprises removing portions of the conductive layer, and wherein the selectively removing step results in the formation of a control gate and a floating gate in the cell area, and a gate electrode of a thin film transistor in the peripheral area.

5. The method of claim 2, further comprising a step of forming a second insulating film on an entire surface of the semiconductor substrate after performing the step of forming the first insulating film, wherein the step of forming the upper insulating film comprises forming the upper insulating film on the second insulating film, and wherein the selectively removing step also comprises selectively removing portions of the second insulating film.

6. The method of claim 1, further comprising a step of forming a conductive layer, wherein the selectively removing step further comprises removing portions of the conductive layer, and wherein the selectively removing step results in the formation of a control gate and a floating gate in the cell area, and a gate electrode of a thin film transistor in the peripheral area.

7. A method for fabricating a flash memory device, comprising:
   forming a tunneling oxide film and a peripheral oxide film, respectively, on a cell area and a peripheral area of a substrate;
   forming a floating gate line on the tunneling oxide film;
   forming a first insulating film on a surface of the floating gate line;
   forming an upper insulating film on an entire surface of the semiconductor substrate;
   removing the upper insulating film from the peripheral area;
   removing the peripheral oxide film and a portion of the upper insulating film over the cell area during a single etching step; and
   selectively removing portions of the remaining portion of the upper insulating film, the first insulating film, and the floating gate line.

8. The method of claim 7, further comprising:
   forming a control gate and a floating gate; and
   forming source/drain regions at sides of the control gate and the floating gate.

9. The method of claim 7, further comprising a step of forming a conductive layer, wherein the selectively removing step further comprises removing portions of the conductive layer, and wherein the selectively removing step results in the formation of a control gate and a floating gate in the cell area, and a gate electrode of a thin film transistor in the peripheral area.

10. The method of claim 7, further comprising a step of forming a second insulating film on an entire surface of the semiconductor substrate after performing the step of forming the first insulating film, wherein the step of forming the upper insulating film comprises forming the upper insulating film on the second insulating film, and wherein the selectively removing step also comprises selectively removing portions of the second insulating film.

11. The method of claim 6, further comprising a step of forming source and drain regions in the substrate on sides of the control gate and floating gate, and on sides of the gate electrode of the thin film transistor.

12. The method of claim 1, further comprising a step of forming a second insulating film on an entire surface of the semiconductor substrate after performing the step of forming the first insulating film, wherein the step of forming the upper insulating film comprises forming the upper insulating film on the second insulating film, and wherein the selectively removing step also comprises selectively removing portions of the second insulating film.

13. The method of claim 12, wherein the upper insulating film and the second insulating film have different etching selectivities.

14. The method of claim 12, wherein the first insulating film comprises an oxide film, wherein the second insulating film comprises a silicon nitride film, and wherein the upper insulating film comprises an oxide film.

15. The method of claim 12, wherein the second insulating film has a thickness of about 120 Å or less.

16. The method of claim 1, wherein the peripheral oxide film has a thickness of about 200 Å or less.

17. The method of claim 1, wherein the upper insulating film has a thickness of about 300 Å or less.

18. The method of claim 6, wherein the upper insulating film, the second insulating film and the first insulating film form an ONO structure between the control gate and the floating gate.

19. The method of claim 1, wherein the tunneling oxide film is formed by thermally oxidizing the semiconductor substrate.

20. The method of claim 1, wherein the first insulating film is formed on a surface of the floating gate line by a thermal oxidation process.

21. The method of claim 1, wherein the upper insulating film and the peripheral oxide film have approximately the same etching speed.

22. The method of claim 1, wherein the upper insulating film is removed from the peripheral area by a wet etching process using an HF buffer solution.

23. The method of claim 1, further comprising a step of implanting ions into the entire surface of the semiconductor substrate after removing the upper insulating film from the peripheral area to adjust a threshold voltage.

24. The method of claim 1, wherein the peripheral oxide film is removed from the peripheral area using phosphate.

25. The method of claim 1, wherein the step of removing a portion of the upper insulating film from the cell area leaves a portion of the upper insulating film having a thickness of 50 Å or greater in the cell area.

26. The method of claim 1, wherein the step of forming an upper insulating film comprises a CVD process.

27. The method of claim 1, wherein the step of forming the upper insulating film comprises a thermal oxidation process.

28. The method of claim 1, wherein the first insulating film has a thickness of about 150 Å or less.

* * * * *